United States Patent [19]

Hall

[11] 4,326,553
[45] Apr. 27, 1982

[54] MEGASONIC JET CLEANER APPARATUS

[75] Inventor: William B. Hall, Dallas, Pa.

[73] Assignee: RCA Corporation, New York, N.Y.

[21] Appl. No.: 181,985

[22] Filed: Aug. 28, 1980

[51] Int. Cl.³ ............................................. B08B 3/00
[52] U.S. Cl. ..................................... 134/153; 134/1;
134/184; 239/102; 239/592
[58] Field of Search ..................... 134/1, 33, 184, 153,
134/198, 199; 239/4, 102, 592, 594

[56] References Cited

U.S. PATENT DOCUMENTS

| | | | |
|---|---|---|---|
| 2,713,998 | 7/1955 | Eicken | 239/102 |
| 2,738,173 | 3/1956 | Massa | 239/102 |
| 3,114,654 | 12/1963 | Nishiyama et al. | 239/102 |
| 3,373,752 | 3/1968 | Inoue | 134/1 |
| 3,499,792 | 3/1970 | Veith | 134/1 |
| 3,893,869 | 7/1975 | Mayer et al. | 134/184 |
| 3,900,162 | 8/1975 | Titus et al. | 239/102 |
| 4,111,546 | 9/1978 | Maret | 134/1 |
| 4,178,188 | 12/1979 | Dussault | 134/1 |

FOREIGN PATENT DOCUMENTS 1215916 12/1970 United Kingdom .

Primary Examiner—S. Leon Bashore
Assistant Examiner—Michael Goldman
Attorney, Agent, or Firm—Birgit E. Morris; Donald S. Cohen; Joseph D. Lazar

[57] ABSTRACT

An apparatus for cleaning a surface of an article such as a semiconductor wafer with cleaning fluid includes a nozzle extending from a chamber for developing a jet of cleaning fluid. The fluid is pressurized and megasonic energy is applied to the fluid by a megasonic transducer. The nozzle is shaped to provide a ribbon-like jet of cleaning fluid vibrating at megasonic frequencies for impingement on the surface of the article.

4 Claims, 3 Drawing Figures

MEGASONIC JET CLEANER APPARATUS

BACKGROUND OF THE INVENTION

This invention relates to a transducer assembly adapted to oscillate at an ultrasonic frequency for modulating a jet stream of fluid expelled through a nozzle for cleaning articles such as semiconductor wafers.

Cleaning systems for use in manufacturing semiconductor devices effectively utilize ultrasonic energy which is propagated into standard chemical solutions by transducer crystals. The crystals may oscillate at an ultrasonic frequency in the range of between about 0.2 and 5 MHz. Such cleaning systems are known as "megasonic" cleaning systems. These systems are known to remove particles down to at least 0.3 micrometer in diameter from the surface of semiconductor wafers together with organic surface film, ionic impurities, and many other contaminants. A megasonic cleaning system for cleaning both surfaces of a wafer simultaneously is disclosed in U.S. Pat. No. 3,893,869 issued to A. Mayer and S. Shwartzman on July 8, 1975 and assigned to RCA Corporation.

There is a need in the art for certain applicatons for a system using the megasonic cleaning principle without the need of immersing the articles to be cleaned in a tank or container of cleaning fluid.

SUMMARY OF THE INVENTION

According to the present invention, a jet stream of cleaning fluid is developed by a nozzle which causes an impingement of the jet stream on the surface of the article to be cleaned. Megasonic energy modulates the stream of fluid in the nozzle structure whereby the stream of fluid includes velocity energy components developed by the nozzle plus velocity energy components developed by the megasonic transducer.

DETAILED DESCRIPTION OF A PREFERRED EMBODIMENT

Figure 1:
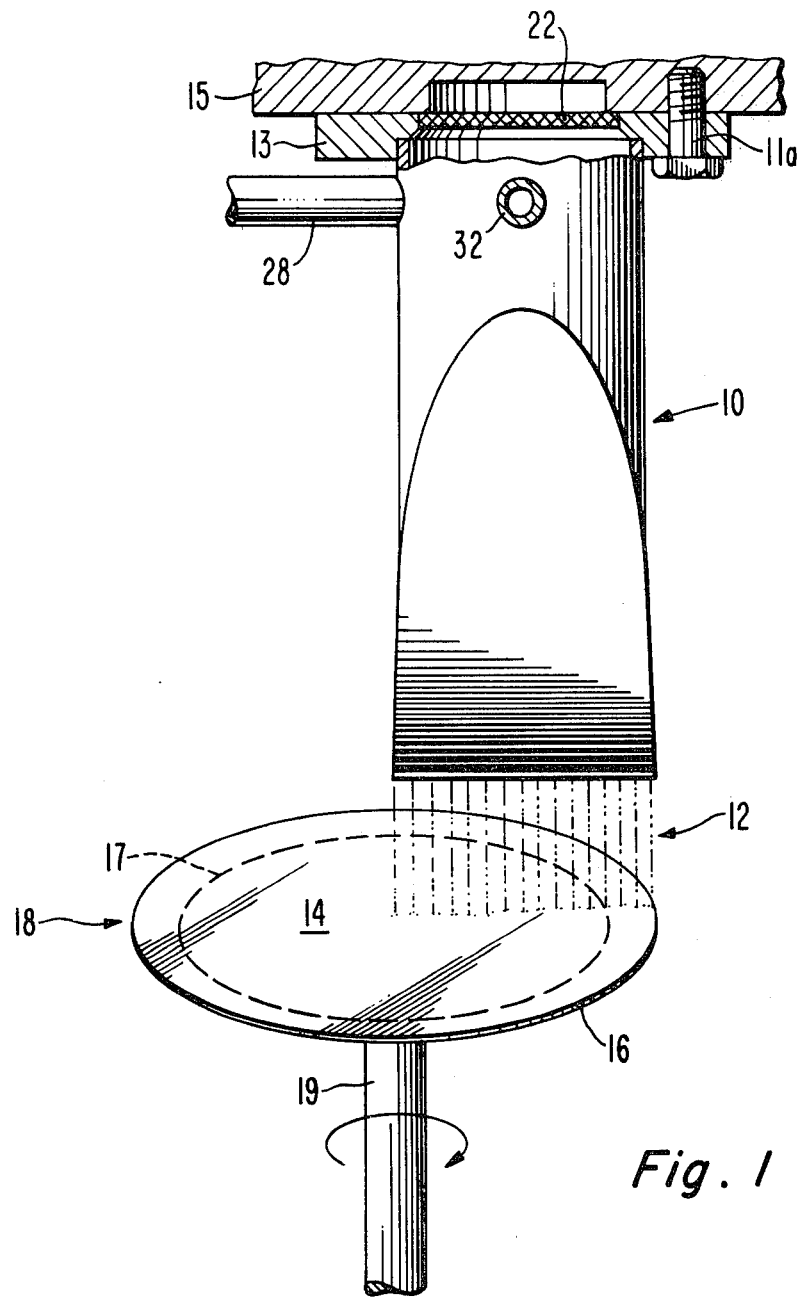
FIG. 1 is a schematic of a system showing the cleaning nozzle of the invention cooperating with a wafer support mechanism.

As seen in FIG. 1, the nozzle assembly 10 (to be described) is positioned to develop a fluid jet 12 for projection in a direction preferably perpendicular to the surface 14 of wafer 16. The transducer 10 is supported on a flange 13 to a support structure 15 by screws 13a. A wafer support apparatus 18 includes a vacuum-type chuck 17 supported on a shaft 19 for holding and rotating the wafer 16 as it faces the jet 12. Assuming a fluid jet in ribbon form of 2" (5.08 cm) in width, a 4" (10.15 cm) wafer 16 can be cleaned by the fluid jet in one rotaton of the wafer with the ribbon of the jet positioned along a radius of the wafer.

The fluid jet 12 has energy velocity developed from the pressure of the supply source of the fluid via inlet tube 28. Typically a suitable cleansing fluid such as a solution of water, hydrogen peroxide and chlorine in the ratio of 4:1:1 by volume is supplied from a source (not shown) under pressure and conducted to the upstream portion of the nozzle at which location the fluid is modulated with ultrasonic energy. The jet stream 12 that is developed by the nozzle when applied to the wafer surface 14 cleanses the surface of the wafer 16 with the combination of the cleansing action of the pressurized cleansing fluid modulated by megasonic energy. The theory of the effect of the ultrasonic energy is believed to be based on the very rapid movement of the fluid molecules which causes an acceleration in the order of 100,000 g generated by a megasonic transducer output of about 7.5 watts per square centimeter. The ultrasonic modulation of the fluid molecules in combinatin with the nozzle pressure of the fluid stream loosens the particles from the surface of the wafer and then washes them away to prevent thereby the particles from being redeposited on the cleansed surface.

The nozzle 10 provides a means for focusing megasonic energy carried in a stream of cleansing fluid into a small area. This nozzle focusing effect increases the power density on the area being cleaned as compared to a megasonic transducer without a nozzle. The increased power density is achieved it is to be understood without requiring additional power to the megasonic transducer.

Figure 2:
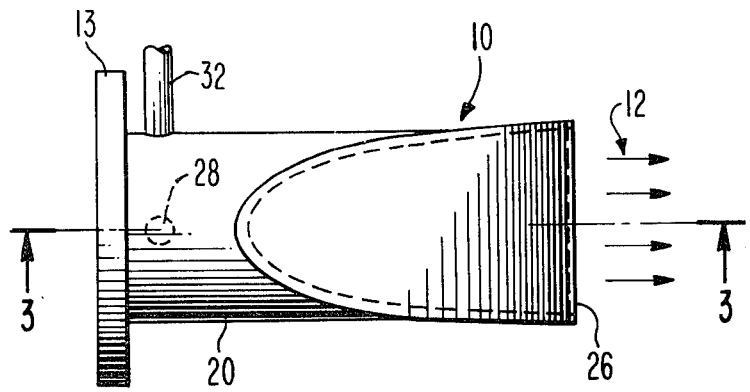
FIG. 2 is a plan view of the nozzle coupled to the transducer.
Figure 3:
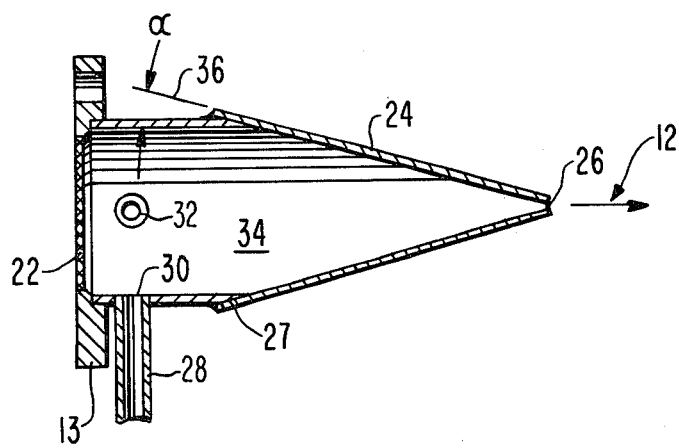
FIG. 3 is a sectional elevation of the nozzle as seen along viewing line 3—3 of FIG. 2.

A particular form of a nozzle 10 is illustrated in FIGS. 2 and 3. The nozzle assembly 10 consists of a cylindrical portion 20 having one open end connected to a megasonic transducer 22. The other end of the portion 20 is connected to a tapered nozzle 24 as by a suitable weld 27. The open end 26 of the nozzle is spaced with a gap of about 20–30 mils (0.5–0.75 mm.) The taper of the nozzle 24 is about 30° with accordingly a ½ angle taper ($\alpha$) of about 15°. A supply of cleansing fluid is conveyed to the nozzle assembly via a tube 28 through port 30. An air bleed tube 32 is provided to relieve air bubbles that may develop within the nozzle chamber 34 in operation. Air bubbles are undesirable because they cause a reduced transfer of energy from the transducer to the fluid within the chamber 20. Furthermore, air bubbles tend to cause the transducer 22 to become overheated while vibrating the fluid. In practice, sufficient fluid pressure in the area of 20 pounds per square inch may be maintained in the nozzle 24 to prevent air bubble formation, particularly when the nozzle 24 is oriented in a downward position.

The angle $\alpha$ related to the nozzle taper as explained above is determined by the extension of one flat wall of the nozzle 24 as shown by line 36 with the surface of the portion 20. This angle is preferably determined by experiment to minimize back reflections that may develop as the fluid passes through the tube 28 and out through the opening 26. Furthermore, a phase shift in the energy waves is caused by the increased effective path length which results from multiple reflections off the inner wall of the nozzle 24. Accordingly, the angle $\alpha$ is selected to minimize both the back reflections and minimize the out-of-phase energy waves that are manifested at the opening 26 of the nozzle 24.

The transducer 22 which is of conventional form is energized by a suitable power supply and oscillated at a frequency between about 0.2 and 5 MHz. Such transducers are piezoelectric crystals which are commercially available from Goulton Industries, Fullerton, Calif. Preferably, lead zerionate titanite crystals are used. Cobalt barium crystals may also be used.

In operation, fluid under pressure of about 20 psi is carried through tube 28 into the chamber 34 for passage through the nozzle end 26 to develop a fluid jet stream 12. The transducer 22 provides megasonic energy vibrations on the fluid contained within the chamber 34 and therefore modulates the jet 12 by so-called megasonic energy. The jet stream 12 is caused to impinge upon the surface 14 of the wafer 16 to cleanse the surface thereof as the shaft 19 of apparatus 18 holds and rotates the wafer across the jet 12.

A modified form of practicing the invention provides for a conical-shaped nozzle for developing a tubular jet rather than the ribbon-like jet developed by the tapered nozzle 24. The nozzles whether of conical or ribbon shaping form can be formed separately and attached to the portion 20 or formed integrally with the portion 20.

What is claimed:

1. An apparatus for cleaning a surface of an article with cleaning fluid comprising:
   nozzle means incluing a nozzle and a chamber for developing a jet of cleaning fluid; said chamber formed of a generally hollow cylinder having two open ends; means for coupling pressurized fluid at a pressure of about 20 psi to the chamber; and an electrically energized megasonic transducer coupled to one end of the chamber to impart megasonic energy to the fluid, said nozzle coupled to the other end of said chamber and formed of a tapered section to an opening to develop a ribbon-like jet of cleaning fluid vibrating at ultrasonic frequencies the taper of said nozzle being at an angle of about 30° to reduce out-of-phase and back reflections of energy waves in the nozzle.

2. An apparatus according to claim 1, further including means for supporting an article in a position for impingement by the fluid jet.

3. An apparatus according to claim 2, further including means for rotating said article about an axis perpendicular to the jet.

4. An apparatus according to claim 1 or 3, including means for bleeding air from the nozzle means to reduce overheating of said transducer.

* * * * *